United States Patent
Madan et al.

(10) Patent No.: US 8,154,938 B2
(45) Date of Patent: Apr. 10, 2012

(54) MEMORY ARRAY POWER DOMAIN PARTITIONING

(75) Inventors: Sudhir K. Madan, Richardson, TX (US); Hugh McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 272 days.

(21) Appl. No.: 12/711,115

(22) Filed: Feb. 23, 2010

(65) Prior Publication Data

US 2010/0226162 A1    Sep. 9, 2010

Related U.S. Application Data

(60) Provisional application No. 61/158,201, filed on Mar. 6, 2009.

(51) Int. Cl.
*G11C 7/00*    (2006.01)

(52) U.S. Cl. .......... 365/206; 365/189.02; 365/203; 365/229

(58) Field of Classification Search .......... 365/145, 365/206, 203, 229, 189.02
See application file for complete search history.

(56) References Cited

U.S. PATENT DOCUMENTS

| | | | | |
|---|---|---|---|---|
| 5,856,947 | A * | 1/1999 | Fang | 365/189.15 |
| 6,061,290 | A * | 5/2000 | Shirley | 365/230.02 |
| 6,449,182 | B1 * | 9/2002 | Ooishi | 365/63 |
| 7,426,147 | B2 * | 9/2008 | Ogiwara et al. | 365/189.09 |

* cited by examiner

*Primary Examiner* — Son Dinh

(74) *Attorney, Agent, or Firm* — Rose Alyssa Keagy; Wade J. Brady, III; Frederick J. Telecky, Jr.

(57) ABSTRACT

An integrated circuit containing a nonvolatile memory circuit which contains memory segments and sense amplifier banks individually powered by a power decoder circuit. A method of accessing a portion of a powered-down memory.

20 Claims, 2 Drawing Sheets

MEMORY ARRAY POWER DOMAIN PARTITIONING

CROSS-REFERENCE TO RELATED APPLICATIONS

This application claims the benefit of priority under U.S.C. §119(e) of U.S. Provisional Application 61/158,201, filed Mar. 6, 2009).

FIELD OF THE INVENTION

This invention relates to the field of integrated circuits. More particularly, this invention relates to circuits and methods for reducing power consumption during nonvolatile memory accesses.

DETAILED DESCRIPTION

Figure 1:
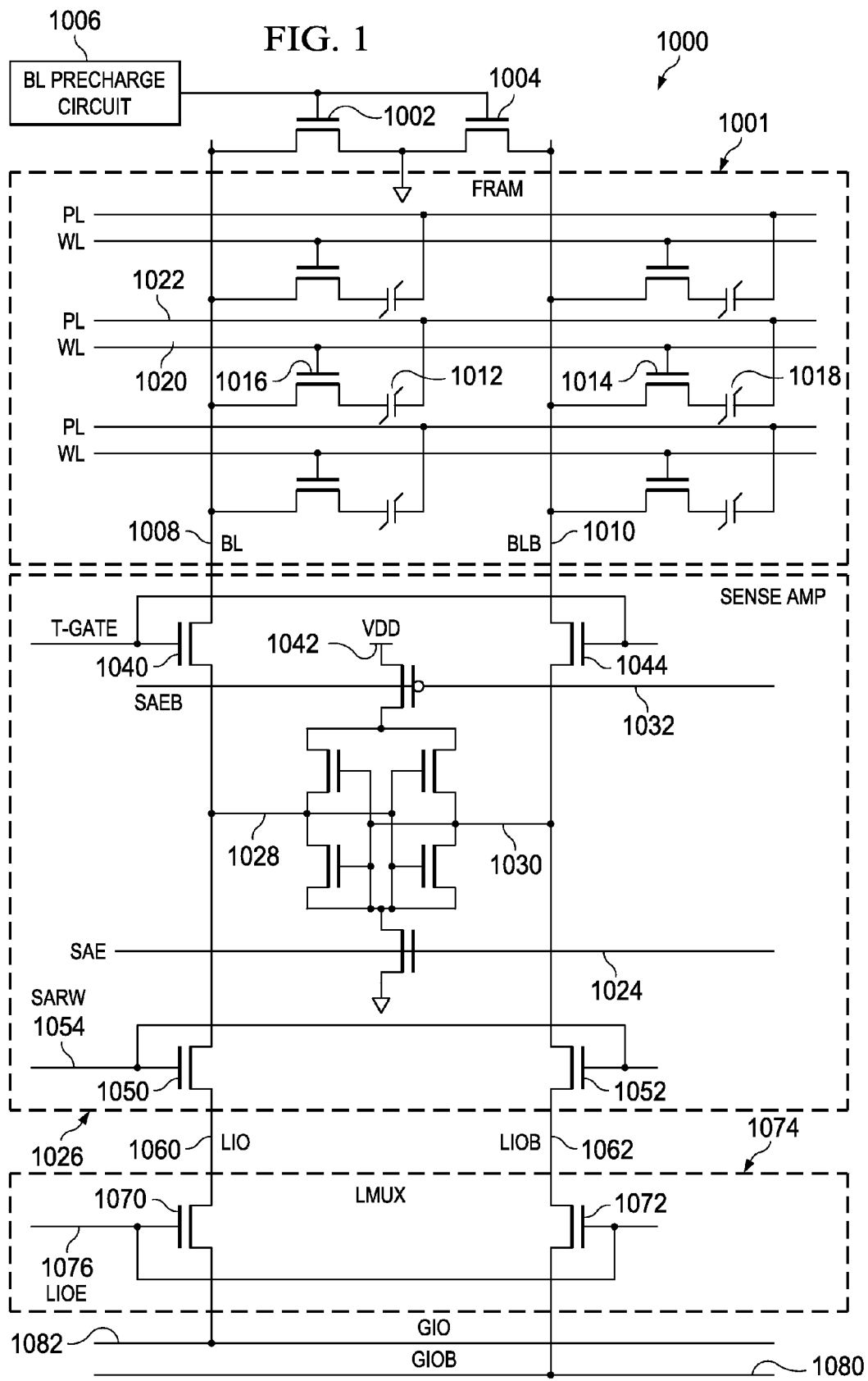
FIG. 1 is a portion of an FRAM memory array

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Minimizing circuit power consumption to prolong battery life is of great interest for portable electronic devices and especially implantable electronic devices. Many electronic devices include integrated circuits with either embedded nonvolatile memory or external nonvolatile memory for storing and retrieving programs and data. Nonvolatile memory may consume significant power when fully powered in a standby mode waiting for a memory access request due to transistor Ioff leakage, diode leakage, and other current leakage paths. One power saving technique is to power-down the memory when it is not in use and then to power up the memory when a memory access request is received. In conventional memories, the entire nonvolatile memory may be powered down when it's in standby mode and then powered up when a memory access request is received. In large memories significant current may be required during the power-up operation to charge all the capacitances and diodes. Therefore, significant power may be required and a significant data access delay time may occur during power-up of a nonvolatile memory.

Embodiments for partitioning a memory into separate power domains and circuits for partitioning power to power up a portion of a powered-down memory when a memory access is requested are described.

The term "standby" refers to the time when a memory array circuit is inactive and waiting for a read or write operation to commence. For a nonvolatile memory such as FRAM, EPROM, EEPROM, PCM (phase change memory), FLASH, or MRAM, the memory array circuit may be powered-down during standby.

The term "power domain" refers to a subcircuit within an integrated circuit. Power within a power domain may be controlled separately from the power to the rest of the integrated circuit. A power domain may be powered-down (either forced to ground or left floating), may be powered-up (returned to Vdd), or may be placed in a reduced voltage power data retention mode independent of the rest of the integrated circuit.

The term "powered-down" means that power has been removed from the circuit or power domain. For example, a p-channel transistor switch may be turned on to supply Vdd to a power domain. When the p-channel transistor is turned off, Vdd is removed from the power domain and it may be forced to ground or left floating in a powered-down state. This typically reduces the leakage from the power supply. Instead of diode leakage from all transistors in the power domain, there is leakage from only the one p-channel switch.

The term "memory access" refers to a request sent to a memory circuit to read data, write data, or refresh data.

The term "associated circuitry", "associated sense amp", "associated plateline circuit", and "associated LMUX" refers to circuitry such as a sense amp, a plateline circuit, and a LMUX that may be coupled to a memory segment or memory segment array. When a memory address in a memory segment array is requested, the memory segment array and the circuitry associated with that memory segment array may be powered up to complete the memory access.

The term "individually coupled" in the sentence, "The power decoder is individually coupled to each sense amplifier bank." means that the power decoder has a separate connection to each sense amplifier bank so that it can provide power to each sense amplifier bank independently of the other sense amplifier banks.

The term "memory block" refers to a portion of a memory circuit which may contain a plurality of memory sections.

The term "memory section" refers to a portion of a memory block which may contain a plurality of memory segments.

The term "memory segment: refers to a portion of a memory section which may contain a plurality of memory segment arrays, a plurality of sense amplifier banks, a bitline precharge circuit, and a LMUX bank.

A ferroelectric memory array (FRAM) circuit is used to illustrate the embodiments, but it is understood the circuits and methods may be used for other nonvolatile memory arrays as well.

An FRAM is a non-volatile ferroelectric random access memory. Typically an FRAM memory array circuit consists of several blocks of FRAM memory along with the control circuitry required to read and write data into specific memory addresses. A block of FRAM memory may consist of several memory sections. A memory section may consist of several memory segments. For example, a one megabit block of FRAM memory may contain 8 memory sections with each section containing 128K FRAM memory cells. Each memory section may contain 8 memory segments with each segment containing 16K FRAM memory cells. The memory in a memory segment of FRAM memory may be arranged in 256 rows and 64 columns.

Typically, power is kept on to the FRAM memory array circuit for fast memory access, but this consumes significant standby power. For example, a one megabit FRAM array at the 130 nm node may consume between 10 and 100 uA of standby current.

A conventional method to reduce power is to reduce or completely remove power from the FRAM array circuit during standby. A problem with this method is that a significant amount of power may be required each time the FRAM memory circuit is powered up. In addition, a significant delay in data access time may occur while waiting for the circuit to charge up to Vdd. An initial charge on the order of 500 pC to 1 nC may be required to power up a one Mbit FRAM array circuit at the 130 nm node.

For low power applications such as implantable electronics, leaving the FRAM array circuit powered up may consume substantial power. However, powering the FRAM array circuit down may also consume substantial charge during power-up—especially if memory access requests are frequent.

In an embodiment described below, an FRAM array circuit is powered-down during standby and only the memory segment containing a requested data address and its associated circuitry are powered up during a memory access. Powering up only the memory segment and the associated circuitry required for a memory access may require significantly less power and may significantly reduce charge up time. For a one megabit FRAM array circuit the power up charge may be reduced from the 500 pC required to power up the whole array to the roughly 50 pC required to power up the one memory segment and its associated circuitry.

A portion of an array column (1001) from a two transistor two capacitor (2T2C) FRAM memory segment (1000) is shown in FIG. 1. One FRAM memory cell consisting of a first ferroelectric capacitor ("FCAP" 1012) and a first pass transistor (1016) are coupled to one bitline ("BL" 1008). A second FCAP (1018) and a second pass transistor (1014) are coupled to a second bitline ("BLB" 1010). The two FCAPs, (1012) and (1018) are programmed with opposite polarities to define a memory state. BL (1008) and BLB (1010) are coupled to the latch nodes (1028) and (1030) of a sense amplifier (1026) via transfer gates (1040) and (1042). The sense-amp (1026) is activated when activation signals are applied to the sense amp enable ("SAE" 1024) and the sense amp enable bar ("SAEB" 1032).

During a read operation, BL (1008) and BLB (1010) are first precharged to ground through discharge transistors (1002) and (1004) which are controlled by the BL precharge circuit (1006). Discharge transistors, (1002) and (1004), are then turned off and BL (1008) and BLB (1010) floated with voltage at 0 volts. The wordline (1020) is selected to turn on pass transistors (1016) and (1014) to connect FCAPs (1012) and (1018) to BL (1008) and BLB (1010) respectively. Plate line (1022) is then pulsed to read the polarization in FCAPs (1012) and (1018). Because FCAPs, (1012) and (1018), are programmed with opposite polarity, one of the bitlines charges up and the other bitline remains close to 0 volts. For example, BL (1008) may charge up to approximately 200 mV and BLB (1010) may remain approximately at 0V. The differential voltage developed across BL (1008) and BLB (1010) is then coupled to sense-amp latch nodes (1028) and (1030) through transfer gate transistors (1040) and (1042). The sense amp is enabled with activation signals applied to SAE (1024) and SAEB (1032). After the sensing is completed, the sense-amp latch nodes (1028) and (1030) are coupled to the local input/output (I/O) lines, LIO (1060) and LIOB (1062), by sending a sense-amp read/write (SARW) signal (1054) to turn on SARW transistors, (1050) and (1052). LIO (1060) and LIOB (1062) are coupled to the global input/output lines, (1080) and (1082), in the local I/O multiplexer, LMUX (1074) using LIO transistors, (1070) and (1072) which are controlled by the local input/output enable (LIOE) signal (1076). It is to be noted that LMUX (1074) has no Vdd connection because it has only n-channel transistors, (1070) and (1072). However, a more complex LMUX may require a Vdd connection. For example, a Vdd connection may be required if the n-channel gates (1070) and (1072) are replaced with CMOS transmission gates where an n-channel plus a p-channel transistor are in parallel.

An FRAM memory circuit may consist of several memory blocks having one megabit of memory in each memory block. Each memory block may consist of 8 memory sections and each memory section may consist of 8 memory segments. Each memory segment may consist of 16 K FRAM cells arranged in 64 columns (0 through 63) and 256 rows. Each segment may have a top and a bottom associated sense-amp bank consisting of 32 sense-amps each. The bottom sense-amp bank may be used to sense signals on even columns and the top sense-amp may be used to sense signals on odd columns.

Figure 2:
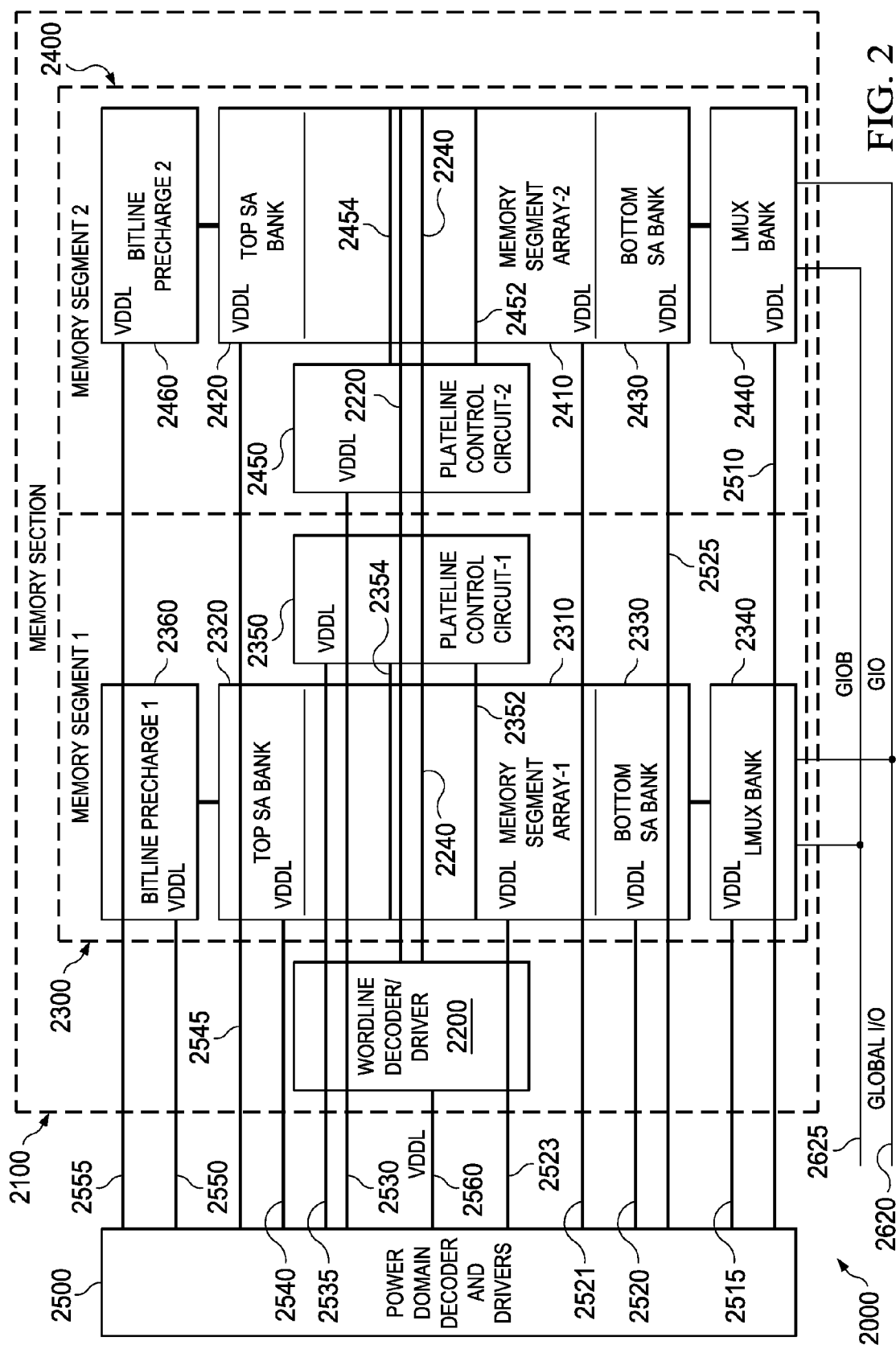
FIG. 2 is a portion of an FRAM memory array circuit formed according to an example embodiment.

A portion of an FRAM memory circuit (2000) is shown in FIG. 2. It consists of a memory section (2100) containing two memory segments, (2300) and (2400). Each memory segment (e.g. 2300) may consist of a 16 Kb memory segment array, (2310) and (2410), with 256 rows and 64 columns. It is to be noted that one or more words (plus error correction bits) may be stored a row of each memory segment (depending on the number of bits per word). A top sense amplifier bank (2320) and a bottom sense amplifier bank (2330) are connected to the memory segment array (2310). Similarly, a top sense amplifier bank (2420) and a bottom sense amplifier bank (2430) are connected to the memory segment array (2410). The sense-amp banks may consist of 32 sense-amps each and may also include sense-amp control logic and driver circuits. The bitline precharge circuits (2360) and (2460) connect to the columns in the memory segments arrays. Plate line control circuit-1 (2350) drives plate lines (2352) and (2354) across memory segment array-1 (2310). Plate line control circuit-2 (2450) drives plate lines (2452) and (2454) across memory segment array-2 (2410). Typically during a memory access, only one plateline (2352) associated with one row in the accessed memory segment array (2310) is activated.

The wordline decoder and driver circuit (2200) (also referred to as wordline decoder) drives the wordlines (2220) and (2240) that span all memory segments (2300) and (2400) in a memory section (2100). During a memory access, the wordline (2220) may be activated to turn on the pass gates of the row of memory cells in both memory arrays (2310) and (2410) (see for example the wordline (1020) and pass transistors (1016) and (1014) of FIG. 1). At the bottom of memory segments, (2300) and (2400) are local input/output multiplexer LMUXs banks, (2340) and (2440), which connect the LIOs (such as LIO (1060) and LIOB (1062) shown in FIG. 1) to the global input/output leads, GIO (2620) and GIOB (2625). The GIO (2620) and GIOB (2625) lines shown in FIG. 2 are data busses and may represent 64 pairs (one for each column in the segment).

The power domain decoder and driver circuit (2500) (also referred to as power domain decoder or power decoder) provides a local power supply voltage, VDDL, to various power domains. It provides VDDL to the bitline precharge circuits (2360) and (2460) using power lines (2550) and (2555). The power decoder (2500) also provides VDDL to top sense amp banks (2320) and (2420) using power lines (2545) and (2540), to plate line control circuits (2350) and (2450) using power lines (2535) and (2530), and to bottom sense amp banks (2330) and (2430) using power lines (2525) and (2520). In addition, the power decoder 2500 provides VDDL to the local I/O multiplexer (LMUX) banks (2340) and (2440) using power lines (2515) and (2510), and to the wordline decoder (2200) using powerline (2560). In an FRAM memory, no power to the memory segment array (2310) and (2410) is required to preserve the data. In the case of volatile memory such as SRAM or DRAM, power to the memory segment array (2310) and (2410) is required at all times and it may be provided from the power decoder (2500) by optional power lines (2521) and (2523). To save power in the case of volatile memories, such as SRAM, the power on the power lines (2521) and (2523) may be reduced when the memory segment array (2310) or (2410) is not being accessed (e.g. when the memory segment array is switched from active mode to standby mode).

To save power, each of the power domains connected to power lines (2510), (2515), (2520), (2525), (2530), (2535), (2540), (2545), (2550), (2555) and (2560) may be powered down when not in use (e.g. VDDL removed). For example, when a memory access request for data from memory segment array-1 (2310) in memory segment 1 (2300) is received, the power domain decoder circuit (2500) may power up only those power domains required to complete the memory access request. In this example embodiment, the bitline precharge 1 circuit (2360), top sense amp bank (2320), bottom sense amp bank (2330), plate line control circuit-1 (2350), LMUX bank (2340), and wordline decoder (2200) may be powered up while the power domains associated with memory segment 2 (2400) remain powered down to conserve power.

In some instances, it may be advantageous to provide power to keeper devices in selected subcircuits in the powered down power domains to maintain appropriate voltage levels on one or more critical nodes. For example, when a memory access is made to memory segment (2300), the wordline (2220) turns on the passgates in memory segment array (2410) as well as memory segment array (2310). To keep the noise level low on the platelines and bitlines (e.g. the plateline (1022) and the bitlines (1008) and (1010) in FIG. 1.) (to prevent noise from disturbing the polarization states in the FRAM capacitors, such as FCAPs (1012) and (1014) in FIG. 1), discharge transistors (e.g. discharge transistors (1002) and (1004) in FIG. 1) may be turned on in segment (2400) by supplying power to the bitline precharge circuit (2460) to hold the bitlines in segment (2400) at ground. If desired, a discharge transistor (not shown) for plateline driver (2450) may be provided to hold the plateline, (2454), at ground during a memory access from (2310).

Typically, before a memory access request is initiated, all the power domains, (2320), (2330), (2340), (2350), (2360), (2420), (2430), (2440), (2450), (2460), and (2200) are powered down. However, the power domains for bitline precharge circuit (2360) and (2460) may instead be kept on to reduce the level of noise on the bitlines. Another option may be to turn both (2360) and (2460) off between two memory accesses and turn both back on after a memory access request is received and before the wordline is activated. When a memory access request is received, only the power domains needed to complete the access are activated (powered up). It takes significantly less time and power to charge up the power domains associated with one memory segment than it takes to charge the power domains associated with all memory segments. Once the associated power domains for the requested memory segment array (2310) are charged up, the wordline (2220) and plateline (2354) associated with the data address (contained within the memory access request) are activated and a signal is produced on the bitlines. The sense amp banks, (2320) and (2330) are then activated to sense the data. After sensing the signals on the bitlines, the data is communicated to other circuit blocks (not shown) in the integrated circuit via the LMUX bank (2340), GIO (2620), and GIOB (2625).

Referring briefly to FIG. 1, if new data is to be written into the cells, it is brought in via GIO (2620), GIOB (2625), and LMUX bank (2340) and written into the sense amps (2330) and (2320). The data is then written into the memory cells via bitlines (e.g. bitlines (1008) and (1010) in FIG. 1) by turning on the wordline (1020) and pulsing the plateline (1022). After the data is written into the memory cells, the bitlines (1008) and (1010) and platelines (1022) are held at ground before the wordline (1020) is deactivated and the power domains are powered down. The power domains shown in FIG. 2 may be left floating to preserve as much charge as possible and reduce the power up charge needed for the next memory access request. It is to be noted that leakage may discharge a power domain to ground if a long time elapses before it is activated again.

In the embodiment described in FIG. 2 a bank of sense amps (2320), (2330), (2420), (2430) consists of a row of 32 sense amps such as the sense amp (1026) shown in FIG. 1. However, the row of sense amps in the bank of sense amps (2320), (2330), (2420), (2430) have their supply pin (1042) connected to the power domain decoder circuit (2500) that supplies a local supply voltage VDDL to the sense amp power domain (instead of being connected to VDD, as shown in FIG. 1).

Conventional FRAM memories do not have separate power domains and do not have a power decoder circuit such as (2500) shown in the embodiment in FIG. 2. In conventional FRAM memories that are powered-down when not in use, all memory segments, sense amp banks, LMUX banks, and plateline circuits are simultaneously powered up when a memory access is requested. Therefore, significant power may be required to charge the capacitance of the entire memory circuit during power-up.

In the embodiment (2000) shown in FIG. 2, one memory section (2100) is shown. However, a memory block may consist of several memory sections which are typically placed vertically adjacent to each other. Moreover, a bottom sense amplifier bank (e.g. 2330) may be shared between two adjacent memory segment arrays (e.g. 2310); therefore, the bottom sense amplifier bank (e.g. 2330) may also function as the top sense amplifier bank (e.g. 2320) of an adjacent memory segment array. For example, a memory segment (2300) with 2 memory segment arrays may have 3 sense amp banks Similarly, a memory segment with 8 memory segment arrays may have 9 sense amps banks Only one LMUX banks (2340) is needed—regardless of the number of memory sections (2100)—since the LIO and LIOB lines (e.g. 1060 and 1062 in FIG. 1) are common to all the memory sections in a memory block.

The memory segment described in FIG. 1 is formed using 2T2C FRAM cells. Each cell consists of two NMOS transistors, (1016) and (1014), and two ferroelectric capacitors (FCAPS), (1012) and (1018). To access a memory cell, the memory segment arrays (2310) in FIG. 2 do not need to be powered up since no Vdd supply is required for the NMOS transistors and the FCAPS. Instead, for a memory access, the wordline decoder (2200) sends a wordline (2220) signal to turn on the passgates and a plateline (2354) signal to read the FCAPS. The bitline precharge (2360) signals also need to be activated. In the case, where the NMOS transistors (1012) and (1018) are replaced with passgates which contain PMOS transistors—or if a memory type containing a PMOS transistor is used in place of the FRAM—then the memory segment array (2310) may also need to be powered-up during a memory access.

Also in the embodiment (2000) shown in FIG. 2, the power decoder circuit (2500) powers up only the segment that contains the requested memory address and only the associated circuitry required to complete the requested memory access. In an example embodiment, a one megabit FRAM having 64 memory segment arrays (8 memory sections with 8 memory segment arrays per memory section) may have 160 separate power domains composed of 72 banks of sense amps, 64 plateline control circuits, 8 bitline precharge circuits (assuming that the power to all of the bitline pre-charge circuits in a section are controlled by one power domain), 8 LMUX banks, and 8 wordline decode and driver circuits. In this embodiment, a total of 6 power domains (2 sense amp banks, 1 plateline control circuit, 1 wordline decoder and driver circuit, 1 bitline pre-charge circuit, and 1 LMUX bank.) may be powered up during a memory access versus the entire memory circuit which is the equivalent of 160 power domains powered up in a conventional FRAM. In another embodiment where all (8 total) of the bitline precharge circuits (e.g. 2360, 2460 . . . ) are kept powered up in a memory section (2100), an additional 5 power domains (2 sense amp banks, 1 plateline control circuit, 1 wordline decoder and driver circuit, and 1 LMUX bank.) may be powered up (for a total of 13 power domains) during a memory access versus the entire memory circuit which is the equivalent of 160 power domains powered up in a conventional FRAM.

In yet another example embodiment where all the bitline precharge circuits are kept powered up in a memory section (2100), the number of power domains in a memory section may be 152 (e.g. 160 minus 8). Furthermore, the total of power domains that need to be powered up during a memory access is five (instead six). There may be other power domains in addition to those described above that may include peripheral circuits that may need to be powered up to complete a memory access operation.

In the embodiment illustrated in FIG. 2, when a memory address is requested from memory segment (2300), the power decoder circuit (2500) powers up associated sense amp banks (2320) and (2330), associated plateline control circuit (2350), associated bitline precharge (2360), associated LMUX bank (2340), and associated wordline decoder (2200) until the memory access is completed and then powers them back down. Estimates show that the initial charge-up power may be reduced from 500 pC for a conventional 1 megabit FRAM memory circuit to about 50 pC; resulting in a approximately 90% reduction in power.

A two transistor, two capacitor 2T2C FRAM memory is used to illustrate one embodiment, but a one transistor, one capacitor 1T1C FRAM memory may also be used. In addition, other nonvolatile memories such as an EPROM, EEPROM, FLASH, PCM, or MRAM memory may be used. The power partitioning in the above example embodiment is for illustrative purposes. Other power partitioning architectures may be used and may result in different amounts of power savings.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a power decoder; and
   a nonvolatile memory coupled to said power decoder, comprising:
     a first memory segment array and a second memory segment array which share a common wordline; and
     a first sense amplifier bank coupled to said first memory segment array and a second sense amplifier bank coupled to said second memory segment array;
   where said power decoder is individually coupled to said first sense amplifier bank and said second sense amplifier bank.

2. The integrated circuit of claim 1 further comprising:
   a first plateline control circuit coupled to said first memory segment array and a second plateline control circuit coupled to said second memory segment array, where said power decoder is individually coupled to said first plateline control circuit and to said second plateline control circuit, and further where said nonvolatile memory is an FRAM.

3. An integrated circuit, comprising:
   a power decoder; and
   an FRAM memory coupled to said power decoder, comprising:
     a first memory segment array and a second memory segment array which share a common wordline; and
     a first sense amplifier bank coupled to said first memory segment array and a second sense amplifier bank coupled to said second memory segment array;
   where said power decoder is individually coupled to said first sense amplifier bank and said second sense amplifier bank.

4. The integrated circuit of claim 3 further comprising a first plateline control circuit coupled to said first memory segment array and a second plateline control circuit coupled to said second memory segment array.

5. A method of accessing a nonvolatile memory, comprising:
   charging selected bitlines of a memory segment array of said nonvolatile memory;
   receiving a memory access request containing a requested data address belonging to said memory segment array;
   activating a wordline associated with said requested data address; and
   powering up a first sense amplifier bank coupled to said memory segment array while not powering up a second sense amplifier bank contained within said nonvolatile memory.

6. The method of claim 5 further comprising:
   before said step of powering up said sense amplifier bank, powering up a first plateline control circuit coupled to said memory segment array while not powering up a second plateline control circuit contained within said nonvolatile memory, where said nonvolatile memory is an FRAM.

7. The method of claim 5 wherein said step of charging selected bitlines follows said step of receiving said memory access request.

8. The method of claim 5 where a power decoder coupled to said nonvolatile memory performs said step of powering up said first sense amplifier bank.

9. The method of claim 5 where said first sense amplifier bank comprises a top sense amplifier bank and a bottom sense amplifier bank.

10. The method of claim 6 where a power decoder coupled to said nonvolatile memory performs said step of powering up said first plateline control circuit.

11. A method of accessing an FRAM memory, comprising:
charging selected bitlines of a memory segment array of said FRAM memory;
receiving a memory access request containing a requested data address belonging to said memory segment array;
activating a wordline associated with said requested data address;
activating a plateline control circuit associated with said requested data address; and
powering up a first sense amplifier bank coupled to said memory segment array while not powering up a second sense amplifier bank contained within said FRAM memory.

12. The method of claim 11 where a power decoder coupled to said FRAM memory performs said step of powering up said first sense amplifier bank.

13. The method of claim 11 where said first sense amplifier bank comprises a top sense amplifier bank and a bottom sense amplifier bank.

14. The method of claim 11 further comprising powering up a first LMUX bank coupled to said first sense amplifier bank while not powering a second LMUX bank contained within said FRAM memory.

15. A method of accessing a volatile memory, comprising:
charging selected bitlines of a first memory segment array of said volatile memory;
receiving a memory access request containing a requested data address belonging to said first memory segment array;
changing said first memory segment array from standby mode to active mode;
activating a wordline associated with said requested data address; and
powering up a first sense amplifier bank coupled to said first memory segment array while not powering up a second sense amplifier bank contained within said volatile memory
where a second memory segment array contained within said volatile memory remains in standby mode.

16. An integrated circuit, comprising:
a power decoder; and
a nonvolatile memory coupled to said power decoder comprising a first sense amplifier bank coupled to a first memory segment array and a second sense amplifier bank coupled to a second memory segment array;
where said power decoder is individually coupled to said first sense amplifier bank and said second sense amplifier bank.

17. A method of accessing a nonvolatile memory, comprising:
charging selected bitlines of a first memory segment array of said nonvolatile memory;
receiving a memory access request containing a requested data address belonging to said first memory segment array;
activating a wordline associated with said requested data address; and
powering up a first sense amplifier bank coupled to said first memory segment array while not powering up a second sense amplifier bank coupled to a second memory segment array and contained within said nonvolatile memory;
wherein said wordline is common to both said first memory segment array and said second memory segment array.

18. A method of accessing an FRAM memory, comprising:
charging selected bitlines of a first memory segment array of said FRAM memory;
receiving a memory access request containing a requested data address belonging to said first memory segment array;
activating a wordline associated with said requested data address;
activating a plateline control circuit associated with said requested data address; and
powering up a first sense amplifier bank coupled to said first memory segment array while not powering up a second sense amplifier bank coupled to a second memory segment array and contained within said FRAM memory;
wherein said wordline is common to both said first memory segment array and said second memory segment array.

19. A method of accessing a volatile memory, comprising:
charging selected bitlines of a first memory segment array of said volatile memory;
receiving a memory access request containing a requested data address belonging to said first memory segment array;
changing said first memory segment array from standby mode to active mode;
activating a wordline associated with said requested data address; and
powering up a first sense amplifier bank coupled to said first memory segment array while not powering up a second sense amplifier bank coupled to a second memory segment array and contained within said volatile memory;
wherein a second memory segment array contained within said volatile memory remains in standby mode;
further wherein said wordline is common to both said first memory segment array and said second memory segment array.

20. An integrated circuit, comprising:
a power decoder; and
an FRAM memory coupled to said power decoder, comprising a first sense amplifier bank coupled to a first memory segment array and a second sense amplifier bank coupled to a second memory segment array;
where said power decoder is individually coupled to said first sense amplifier bank and said second sense amplifier bank.

* * * * *